(12) United States Patent
Watanabe et al.

(10) Patent No.: US 7,593,085 B2
(45) Date of Patent: Sep. 22, 2009

(54) FLEXIBLE PRINTED CIRCUIT AND DISPLAY DEVICE USING THE SAME

(75) Inventors: Kenichi Watanabe, Kumamoto (JP); Hiroshi Ueda, Kumamoto (JP); Hiroshi Tachibana, Kumamoto (JP); Shigeaki Noumi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 302 days.

(21) Appl. No.: 11/383,622

(22) Filed: May 16, 2006

(65) Prior Publication Data
US 2007/0013856 A1 Jan. 18, 2007

(30) Foreign Application Priority Data
Jul. 15, 2005 (JP) .............................. 2005-206450

(51) Int. Cl.
*G02F 1/1345* (2006.01)
(52) U.S. Cl. ...................................... 349/150; 349/149
(58) Field of Classification Search ................ 349/149, 349/150
See application file for complete search history.

(56) References Cited
U.S. PATENT DOCUMENTS
6,657,606 B2 * 12/2003 Kang et al. .................. 345/87

FOREIGN PATENT DOCUMENTS
| CN | 1336788 A | | 2/2002 |
| JP | 2003-195336 | | 7/2003 |
| JP | 2003287766 A | * | 10/2003 |
| JP | 2004-93860 | | 3/2004 |

* cited by examiner

*Primary Examiner*—David Nelms
*Assistant Examiner*—David Y Chung
(74) *Attorney, Agent, or Firm*—Oblon, Spivak, McClelland, Maier & Neustadt, P.C.

(57) ABSTRACT

The present invention provides a flexible printed circuit that is less likely to suffer from erosion (corrosion) of electrode terminals even in severe environments and a display device using the flexible printed circuit. According to the present invention, a flexible printed circuit includes a flexible FPC film, FPC interconnections formed of a given pattern on the FPC film, a solder resist covering the FPC interconnections, and FPC terminals provided at ends of the FPC interconnections to make external connection. According to the invention, the FPC terminals include at least one terminal that has an end located inside of an outline of the FPC film.

8 Claims, 12 Drawing Sheets

F I G . 2
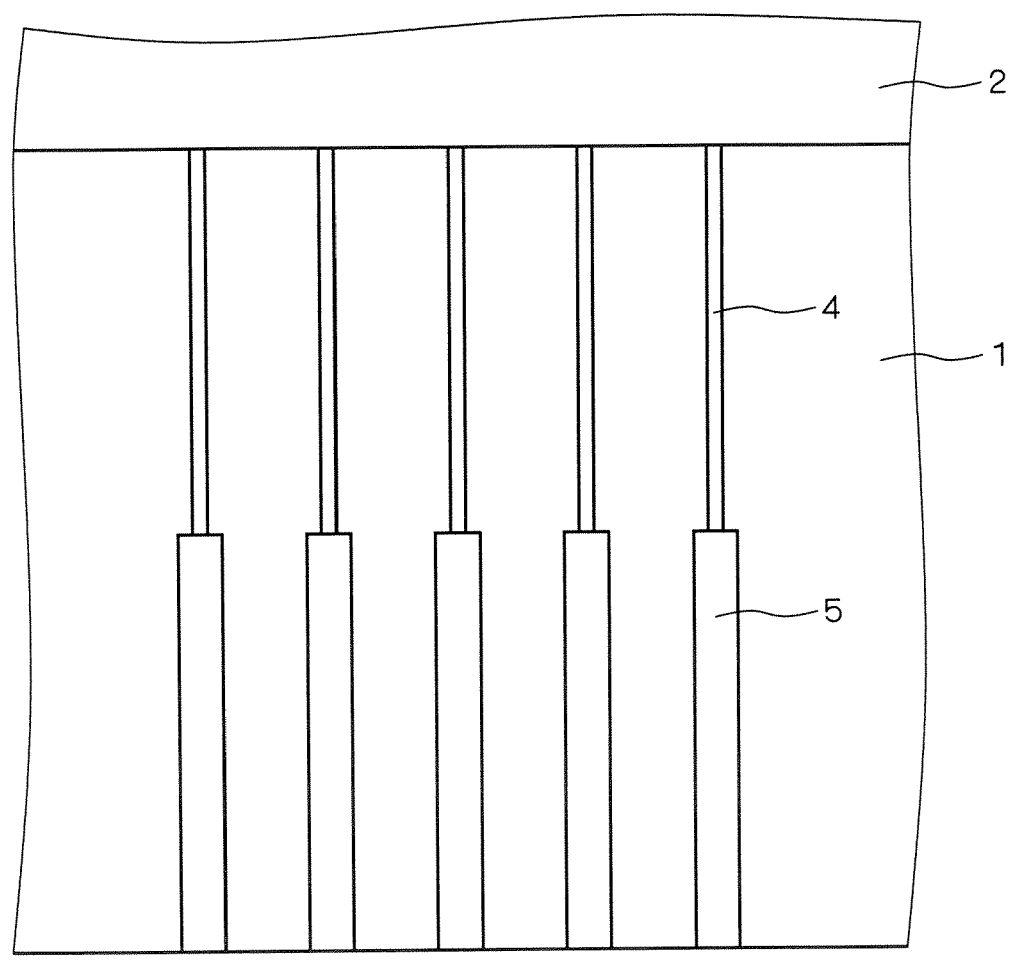

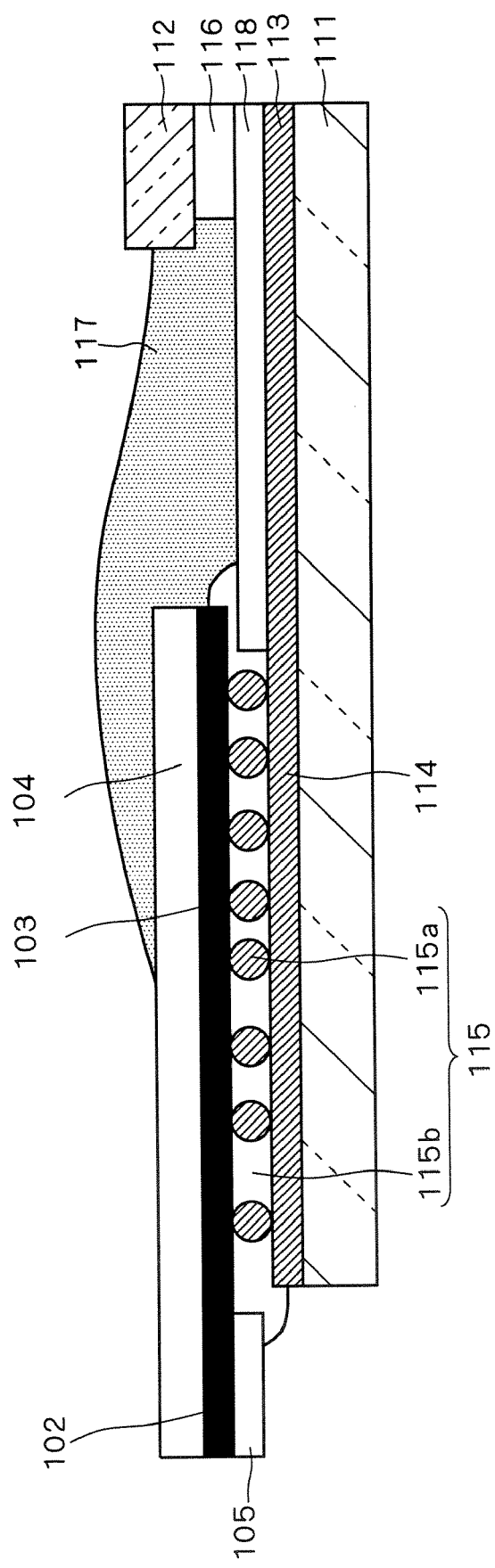

FLEXIBLE PRINTED CIRCUIT AND DISPLAY DEVICE USING THE SAME

BACKGROUND OF THE INVENTION

1. Field of the Invention

The present invention relates to flexible printed circuits and display devices using the same, and particularly to the structure of terminals of a flexible printed circuit that are connected to electrode terminals of a display panel.

2. Description of the Background Art

A conventional liquid-crystal display device includes two rectangular glass substrates, each having two longer sides and two shorter sides, with liquid crystal sandwiched therebetween, driver circuitry connected to interconnections on the glass substrates, and an illumination device placed on the back of the glass substrates. Particularly, in a liquid-crystal display device using thin film transistors (TFTs), the TFTs are arranged in a matrix on a first glass substrate, and an opposing electrode is formed on the second glass substrate. Also, electrode terminals are provided in the peripheral area of the first glass substrate in order to connect interconnections extending from the TFTs to the driver circuitry. Accordingly, the first glass substrate is larger than the second glass substrate by the area for the formation of the electrode terminals, and the periphery of the first glass substrate projects over the second glass substrate.

Each TFT is connected to the corresponding pixel and turns on/off to control an image signal sent to the pixel. The image signal is supplied from a source line connected to the source electrode of the TFT. The source lines are placed in parallel with the shorter sides of the glass substrate and connected to the electrode terminals provided in a peripheral area along a longer side of the glass substrate. On the other hand, control signals for controlling the TFTs are supplied from gate lines connected to the gate electrodes of the TFTs. The gate lines are placed in parallel with the longer sides of the glass substrate and connected to the electrode terminals provided in a peripheral area along a shorter side of the glass substrate.

The electrode terminals are connected to the driver circuitry through a flexible printed circuit (FPC). The FPC includes an FPC film made of an insulative film having a thickness of about 30 pm to 70 pm, FPC interconnections made of copper foil having a thickness of about 8 pm to 25 pm, and a polyimide-based solder resist covering the FPC interconnections. The FPC film is formed of a material that can be bent freely. Also, FPC terminals are formed at ends of the FPC interconnections, and the solder resist is absent on this area.

The FPC terminals are connected to the electrode terminals on the glass substrate through an anisotropic conductive film (ACF). The FPC terminals and the electrode terminals are thus electrically connected to each other through conductive particles contained in the ACF, but adjacent ones of the FPC terminals, and adjacent ones of the electrode terminals, are not electrically connected to each other because of the presence of insulative epoxy resin around the conductive particles.

In conventional liquid-crystal display devices, an insulative coating material is applied with a dispenser to an area extending from a sealing material of the liquid-crystal panel to the electrode terminals, in order to prevent corrosion of the interconnections in this area. Such techniques for preventing corrosion of electrode terminals are disclosed as an example of a liquid-crystal display device in Japanese Patent Application Laid-Open No. 2003-195336 (hereinafter referred to as Patent Document 1), and as an example of a plasma display device in Japanese Patent Application Laid-Open No. 2004-93860 (hereinafter referred to as Patent Document 2).

Patent Document 1 discloses an example of a liquid-crystal display device in which an insulative coating material coats an area from the electrode terminals connected to the FPC terminals to the sealing material of the liquid-crystal panel. Patent Document 2 discloses an example of a plasma display device in which an insulative coating material coats an area from the electrode terminals connected to the FPC terminals to the sealing material of the panel. Thus, conventional display devices have some means to prevent corrosion of the electrode terminals.

However, when such a display device undergoes a reliability test in a severe environment, e.g., in a hot and humid environment, water may penetrate the insulative coating material to invade the ACF. When water invades the ACF, higher-potential electrode terminals may corrode away as minus ions in areas where the higher-potential electrode terminals are placed adjacent to lower-potential electrode terminals, which results in disconnection of the electrode terminals (the phenomenon called erosion or corrosion). The disconnection of electrode terminals stops supply of desired signals to pixels and then the display device suffers from display defects.

SUMMARY OF THE INVENTION

An object of the present invention is to provide an FPC that is less likely to suffer from erosion (corrosion) of electrode terminals even in severe environments and a display device using the FPC.

An FPC of the invention includes a flexible insulative film, interconnections formed of a given pattern on the flexible insulative film, a resist layer covering the interconnections, and terminals provided at ends of the interconnections to make external connections. In the FPC of the present invention, at least one of the terminals has its end located inside an outline of the insulative film.

According to the FPC of the invention, the ends of terminals are located inside an outline of the insulative film. Accordingly, when the terminals are connected to external electrode terminals, the insulative film covers the connections so that the electrode terminals are less likely to suffer from erosion (corrosion) even in severe environments.

According to the present invention, a display device includes a display panel and a an FPC. The display panel has in its peripheral area a plurality of electrode terminals that supply a signal necessary for driving. The FPC includes a flexible insulative film, interconnections formed of a given pattern on the insulative film, a resist layer covering the interconnections, and terminals provided at ends of the interconnections to make external connections. At least one of the terminals has its end located inside an outline of the insulative film. Also, in the display device of the invention, the at least one terminal having its end located inside the outline of the insulative film is connected to a corresponding one of the electrode terminals.

The display device of the invention is less likely to suffer from erosion (corrosion) of the electrode terminals even in severe environments, which reduces inferior displays and enhances reliability.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a plan view showing electrode terminals according to the first preferred embodiment of the invention;

FIG. 12 is a cross-sectional view illustrating the connection between the electrode terminals and FPC terminals for the purpose of describing the present invention.

DESCRIPTION OF A COMMON FPC

Figure 9:
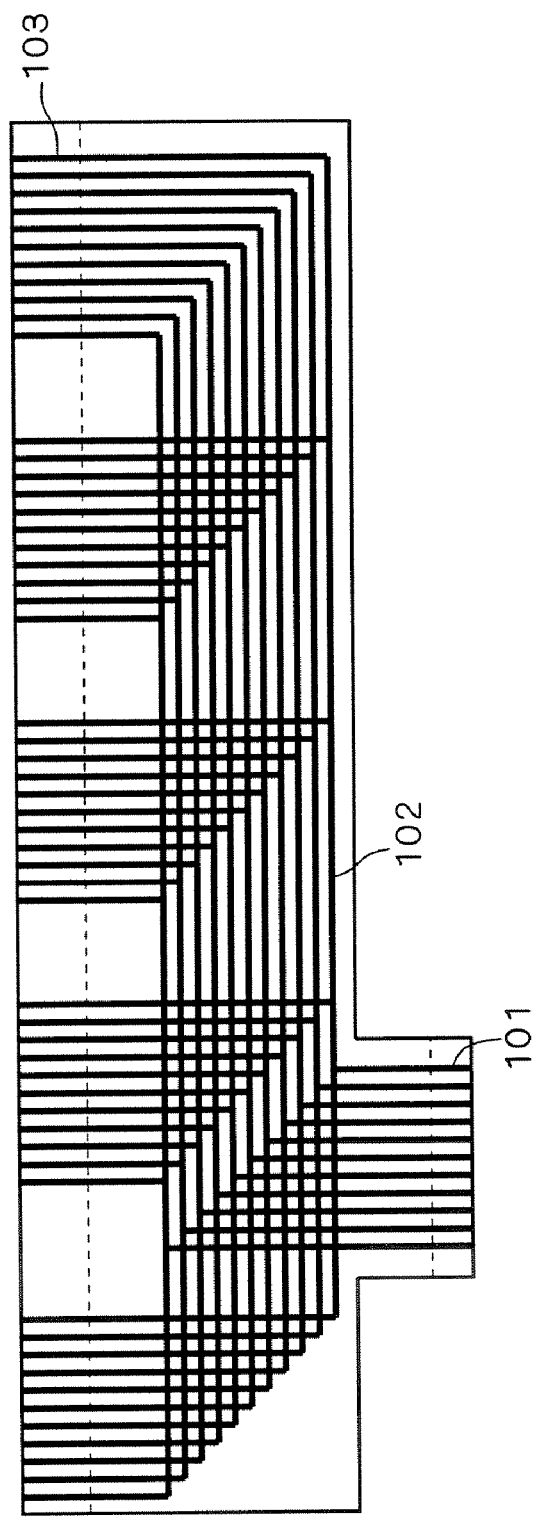
FIG. 9 is a plan view of an FPC that is used to describe the invention.

Prior to the description of the FPC according to a first preferred embodiment, a common FPC will now be described. FIG. 9 is a plan view of a common FPC. The FPC of FIG. 9 includes FPC input terminals 101 and FPC terminals 103 connected thereto through FPC interconnections 102. In the FPC shown in FIG. 9, the FPC terminals 103 are provided in five areas, while the FPC input terminals 101 are provided in one area.

Figure 10A:
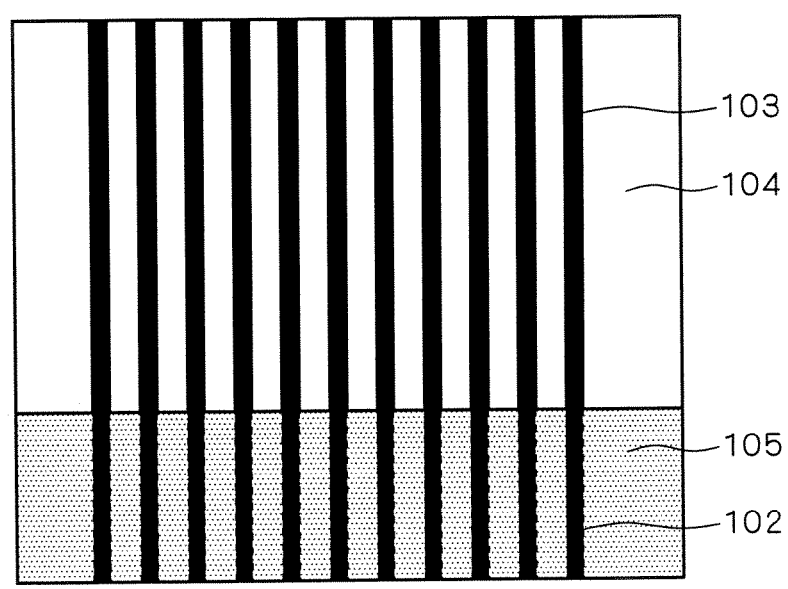
FIGS. 10A and 10B are a plan view and a cross-sectional view showing FPC terminals for the purpose of describing the invention.
Figure 10B:
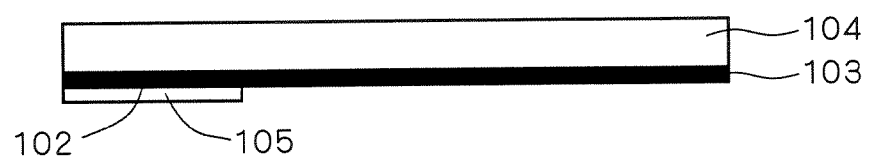

FIG. 10A is a plan view of an area where FPC terminals 103 reside, and FIG. 10B is a cross-sectional view of the area including the FPC terminals 103. As shown in FIG. 10B, the FPC includes an FPC film 104 having a thickness of about 30 pm to 70 pm, FPC interconnections 102 and FPC terminals 103 having a thickness of about 8 pm to 25 pm, and a polyimide-based solder resist 105 covering the FPC interconnections 102.

Figure 11:
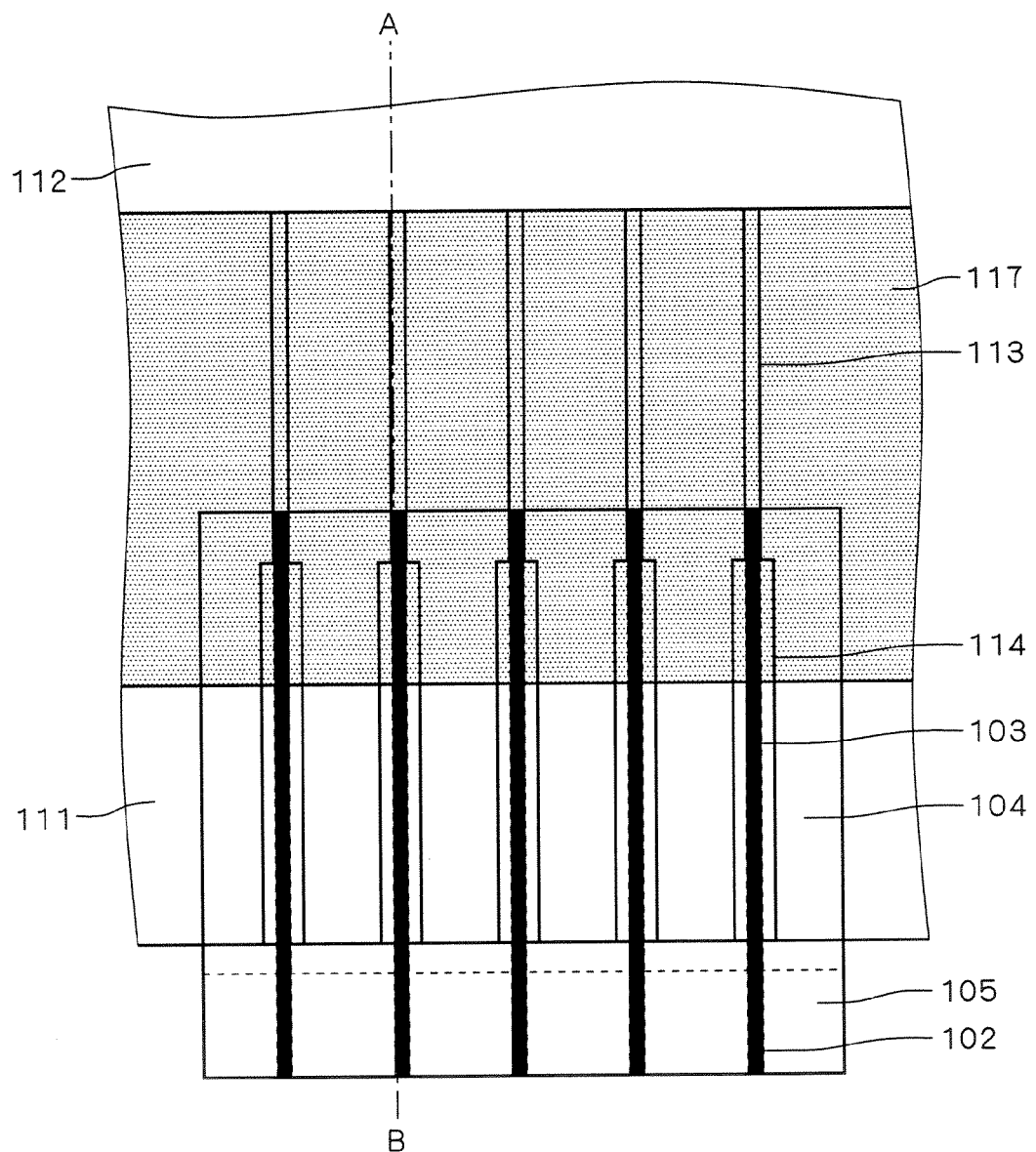
FIG. 11 is a plan view showing connections between electrode terminals and FPC terminals for the purpose of describing the present invention.

FIG. 11 is a plan view of the FPC terminals 103 shown in FIGS. 10A and 10B connected to electrode terminals of a display panel, and FIG. 12 shows the cross section taken along the plane A-B in FIG. 11. In FIG. 11, the electrode substrate 111, on which pixel electrodes and the like (not shown) are formed, is larger than the opposing substrate 112 on which the opposing electrode and the like (not shown) are formed, and so FIG. 11 shows a peripheral area that is formed only of the electrode substrate 111. In the peripheral area formed only of the electrode substrate 111, there are electrode terminals 114 and panel interconnections 113 that are connected to the pixel electrodes and the like.

As shown in FIG. 12, the FPC terminals 103 are connected to the electrode terminals 114 with an ACF 115. More specifically, the FPC terminals 103 and the electrode terminals 114 are precisely aligned with each other, and the FPC terminals 103 and the electrode terminals 114 are bonded together by thermo-compression bonding using a heating-pressurizing tool, with the ACF 115 interposed between them. This process is performed under conditions of a heating temperature of 170° C. to 200° C., a pressurizing force of 2 MPa to 10 MPa, and a heating-pressurizing time of 10 sec to 20 sec. This thermo-compression bonding process causes conductive particles 115a contained in the ACF 115 to come into contact with the FPC terminals 103 and the electrode terminals 114, and then the FPC terminals 103 and the electrode terminals 114 become conductive with each other. The FPC terminals 103 and the electrode terminals 114 are thus electrically connected together, allowing image signals and control signals from the driver circuitry to be supplied to the display panel through the flexible printed circuit.

The diameter of the conductive particles 115a is smaller than the intervals between adjacent FPC terminals 103, and the insulative epoxy resin 115b exists around the conductive particles 115a, so that adjacent FPC terminals 103 are not short-circuited.

Finally, as shown in FIGS. 11 and 12, an insulative coating material 117 is applied to an area extending from a sealing material 116 to the electrode terminals 114, in order to prevent corrosion in this area. A dispenser is used to apply the insulative coating material 117. Also, as shown in FIG. 12, an insulating film 118 is formed on the panel interconnections 113 in an area from the sealing material 116 to the electrode terminals 114.

As mentioned earlier, when such a common FPC undergoes a reliability test in a severe environment, e.g., a hot and humid environment, water may invade the ACF 115 through the insulative coating material 117. More specifically, in the common FPC, as shown in FIG. 12, the ACF 115 is in direct contact with the insulative coating material 117 and therefore water easily reaches the ACF 115 once it penetrates through the insulative coating material 117.

DESCRIPTION OF TWO PREFERRED EMBODIMENTS

The present invention has been made to solve this problem, and two preferred embodiments of such an FPC and display devices using the same will now be described.

First Preferred Embodiment

Figure 1:
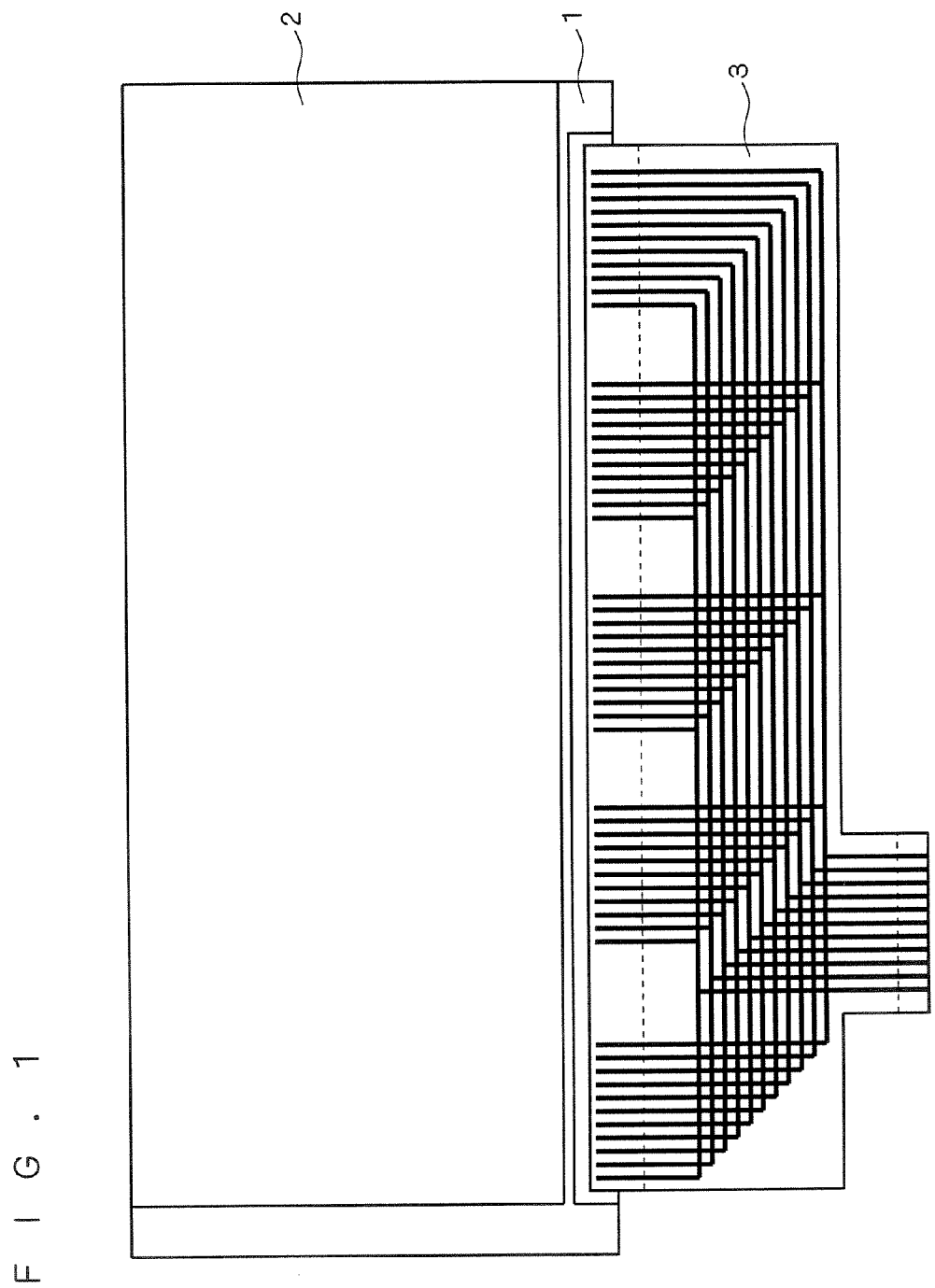
FIG. 1 is a plan view of a display device according to a first preferred embodiment of the invention.

First, FIG. 1 is a plan view of a display device equipped with a FPC according to the first preferred embodiment. In FIG. 1, an electrode substrate 1 on which pixel electrodes and the like (not shown) are formed and an opposing substrate 2 on which an opposing electrode and the like (not shown) are formed are placed on each other to form a display panel. The electrode substrate 1 is larger than the opposing substrate 2, and so there is a peripheral area that is formed only of the electrode substrate 1. An FPC 3 is attached to the peripheral area formed only of the electrode substrate 1.

FIG. 2 is a plan view showing in an enlarged manner the peripheral area formed only of the electrode substrate 1. FIG. 2 shows panel interconnections 4 and electrode terminals 5 that are connected to pixel electrodes and the like (not shown). The panel interconnections 4 and the electrode terminals 5 are electrically connected to each other, and the electrode terminals 5 have a larger width than the panel interconnections 4. This is because the electrode terminals 5 are connected to the FPC 3. While this preferred embodiment describes the display device mainly as a liquid-crystal display device, this is not intended to limit the present invention. The present invention is applicable also to display devices of any other types that have a display panel in which a plurality of electrode terminals are provided in a peripheral area for the purpose of supplying signals necessary for driving, such as plasma display devices.

Figure 3:
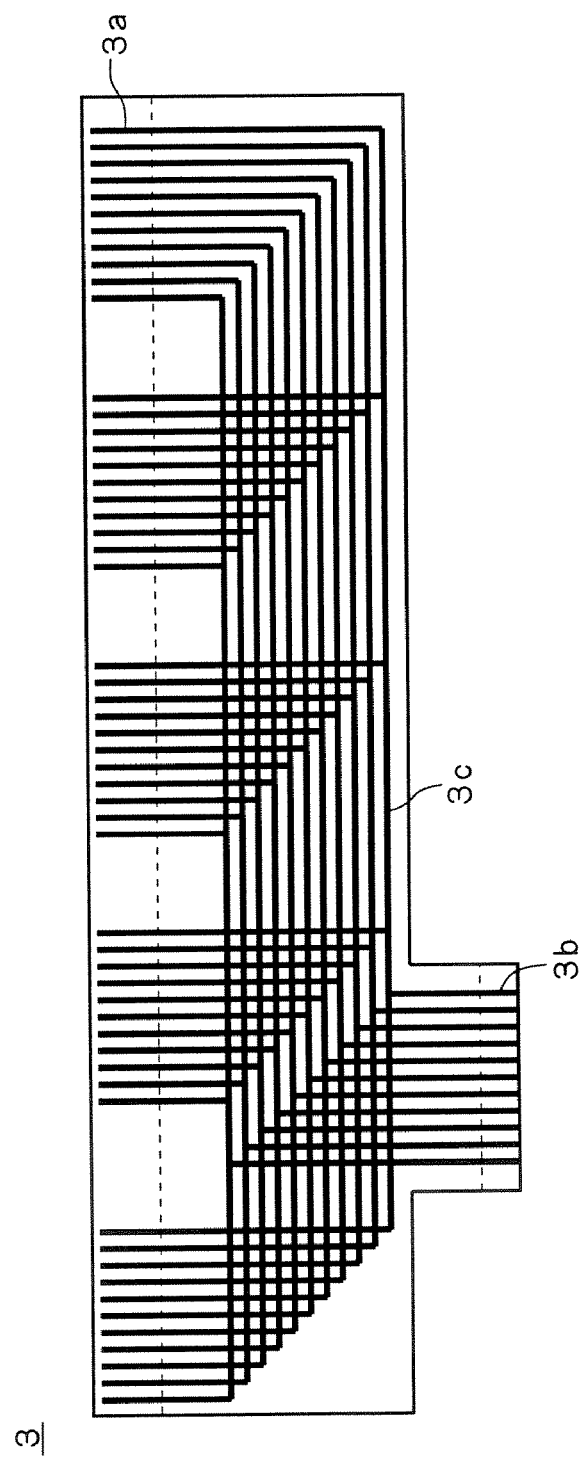
FIG. 3 is a plan view of an FPC according to the first preferred embodiment of the invention.

Next, FIG. 3 is a plan view of the FPC 3 of this preferred embodiment. In the FPC 3 shown in FIG. 3, FPC terminals 3*a* and FPC input terminals 3*b* are connected through FPC interconnections 3*c*. In the FPC 3 of FIG. 3, the FPC terminals 3*a* are provided in five areas, while the FPC input terminals 3*b* are provided in one area. In this preferred embodiment, as shown in FIG. 3, the FPC interconnections are formed of a given pattern, but this structure is for illustrative purposes only. The present invention is not limited by the routing of the FPC interconnections 3*c*, and the interconnection structure may be formed in any other ways; for example, an IC driver may be provided there.

Figure 4A:
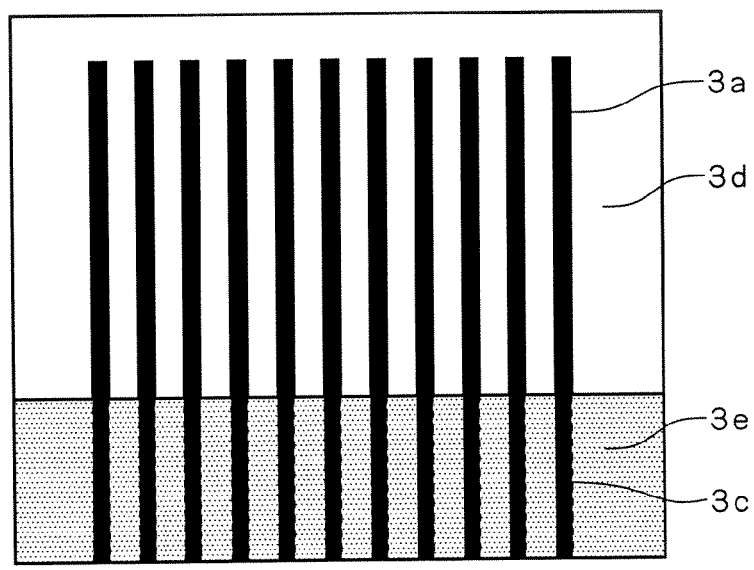
FIGS. 4A and 4B are a plan view and a cross-sectional view showing FPC terminals of the first preferred embodiment of the invention.
Figure 4B:
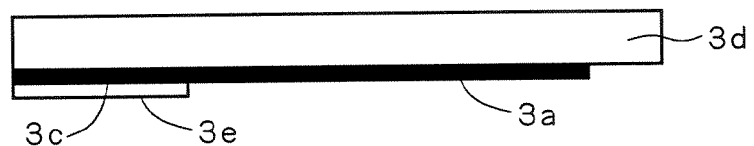

FIGS. 4A and 4B are enlarged views of an area of the FPC 3 where the FPC terminals 3*a* of FIG. 3 reside. FIG. 4A is a plan view of the area including the FPC terminals 3*a* and FIG. 4B is a cross-sectional view of the area including the FPC terminals 3*a*. Referring to FIG. 4B, the FPC 3 FPC includes an FPC film 3*d* made of an insulative film, FPC interconnections 3*c* and FPC terminals 3*a* made of copper foil, and a polyimide-based solder resist 3*e* covering the FPC interconnections 3*c*. The structure of the FPC 3 shown in FIGS. 4A and 4B is basically the same as that of the FPC 3 shown in FIGS. 10A and 10B, but the FPC 3 of FIGS. 4A and 4B differs therefrom in that the ends of the FPC terminals 3*a* are located inside of an outline of the FPC film 3*d*. The FPC film 3*d* is made of material that can be bent freely. The FPC terminals 3*a* are formed at ends of the FPC interconnections 3*c*, and the solder resist 3*e* is absent in this area.

On the other hand, as can be seen from FIG. 3, the ends of the FPC input terminals 3*b* of this preferred embodiment reach an outline of the FPC film 3*d*. This is for the purpose of applying electricity from the FPC input terminal 3*b* side to form the FPC terminals 3*a*, FPC input terminals 3*b*, and FPC interconnections 3*c* by plating. When a process other than the plating is adopted, or when another process follows the plating, it is possible to form the FPC input terminals 3*b* so that their ends are located inside the FPC film 3*d*.

Figure 5:
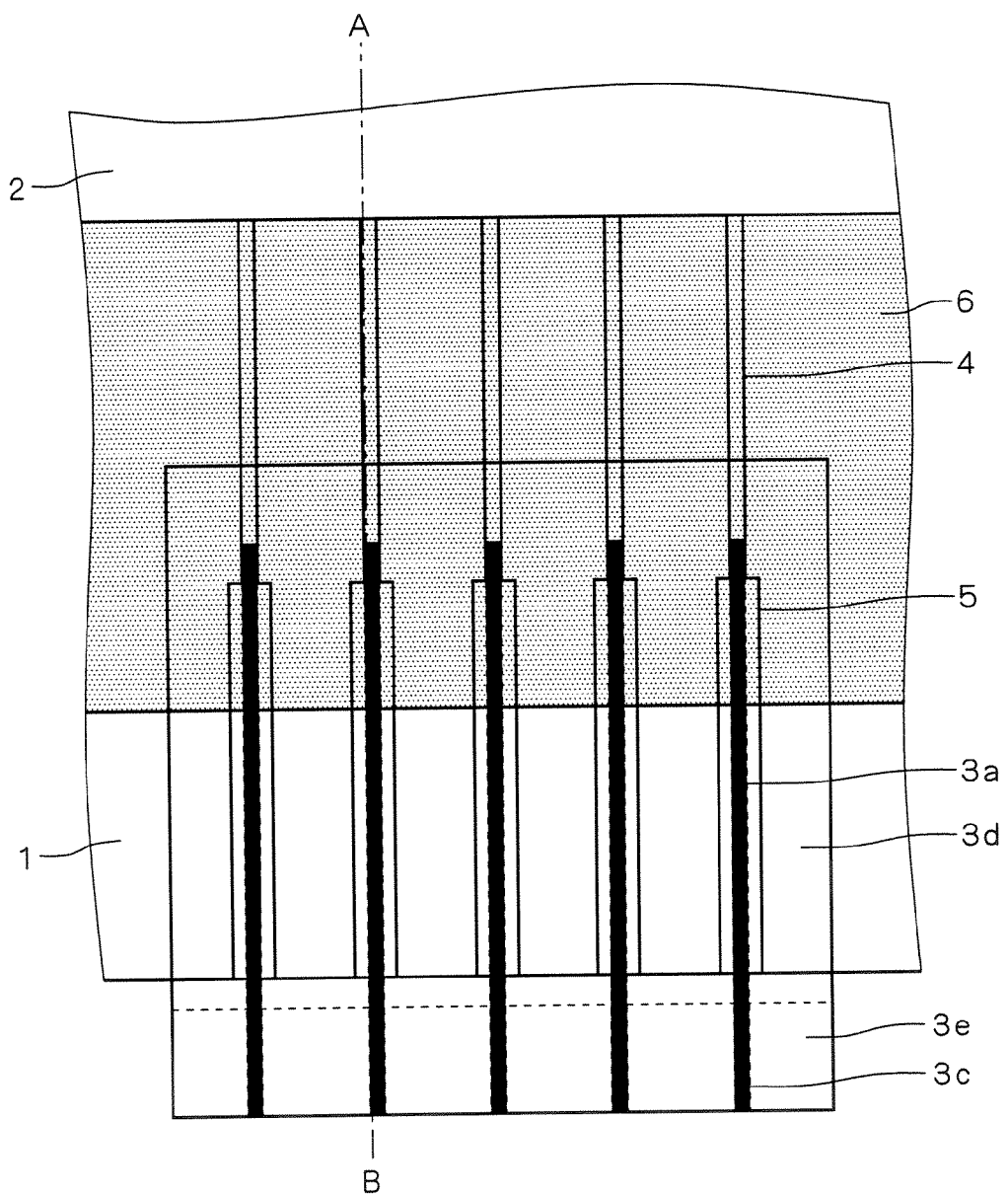
FIG. 5 is a plan view showing connections between the electrode terminals and FPC terminals according to the first preferred embodiment of the invention.

Next, the connection between the FPC terminals 3*a* of the FPC 3 and the electrode terminals 5 will be described referring to FIGS. 5 and 6. FIG. 5 is a plan view of an area where the FPC terminals 3*a* and the electrode terminals 5 are connected to each other, and FIG. 6 is the cross-sectional view taken along plane A-B of FIG. 5.

Figure 6:
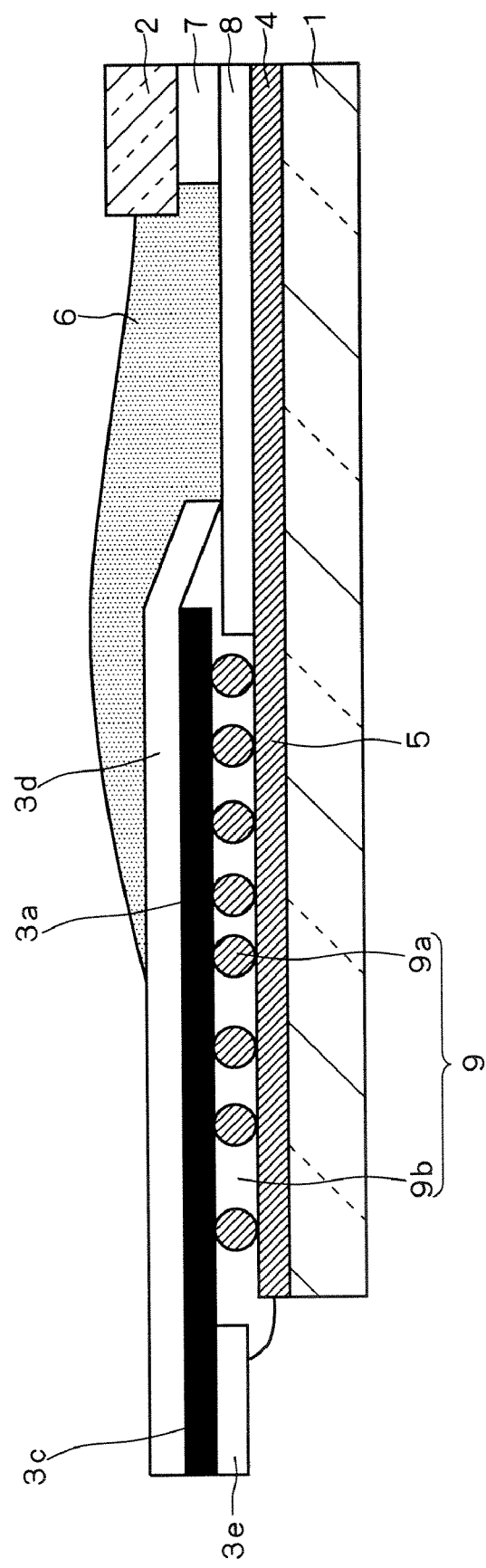
FIG. 6 is a cross-sectional view illustrating the connection between the electrode terminals and FPC terminals according to the first preferred embodiment of the invention.

As shown in FIG. 6, the FPC terminals 3*a* are connected to the electrode terminals 5 with an ACF 9. More specifically, first, the FPC terminals 3*a* and the electrode terminals 5 are precisely aligned and overlapped with each other as shown in FIG. 5. Then, using a heating-pressurizing tool, the FPC terminals 3*a* and the electrode terminals 5 are bonded together by thermo-compression bonding with the ACF 9 between them. The process is performed under the conditions mentioned earlier, i.e., a heating temperature of 170° C. to 200° C., a pressurizing force of 2 MPa to 10 MPa, and a heating-pressurizing time of 10 sec to 20 sec.

In this preferred embodiment, because the FPC film 3*d* is longer than the FPC terminals 3*a*, the FPC film 3*d* covers the edge of the ACF 9 as shown in FIG. 6. In the flexible printed circuit 3 of this preferred embodiment, the ends of the FPC terminals 3*a* are thus located inside the outline of the FPC film 3*d*, and the distance from the ends of the FPC terminals 3*a* to the outline of the FPC film 3*d* is determined such that the FPC film 3*d* covers the edge of the ACF 9 when the flexible printed circuit 3 is attached to the electrode substrate 1.

Finally, as shown in FIG. 6, an insulative coating material 6 is applied to an area extending from a sealing material 7 of the display panel to the electrode terminals 5, in order to prevent corrosion in this area. In general, the insulative coating material 6 can be silicone resin, acrylic resin, fluororesin, urethane resin, or the like. The application of the insulative coating material 6 uses a dispenser. The ACF 9 contains conductive particles 9*a* and epoxy resin 9*b*. Also, as shown in FIG. 6, an insulating film 8 is formed on the panel interconnections 4 in an area extending from the sealing material 7 to the electrode terminals 5.

As described so far, in the FPC 3 of this preferred embodiment, the ends of the FPC terminals 3*a* are formed inside an outline of the FPC film 3*d*, which prevents water from invading the ACF 9 and thus prevents erosion (corrosion) of the electrode terminals in severe environments. Display devices using the FPC 3 of this preferred embodiment offer the same effect as the common FPC described previously and provide highly-reliable display devices with reduced display defects.

Furthermore, in the display device of this preferred embodiment, a resin coating is applied to a peripheral area of the display panel (the area extending from the sealing material 7 to the electrode terminals 5) including the area where the FPC terminals 3*a* and the electrode terminals 5 are connected to each other, which more certainly prevents water from invading the ACF 9 and prevents erosion (corrosion) of the electrode terminals in severer environments.

The marginal portion of the FPC film 3*d* where the FPC terminals 3*a* are absent may be formed thicker than the other area of the FPC film 3*d*.

Second Preferred Embodiment

Figure 7:
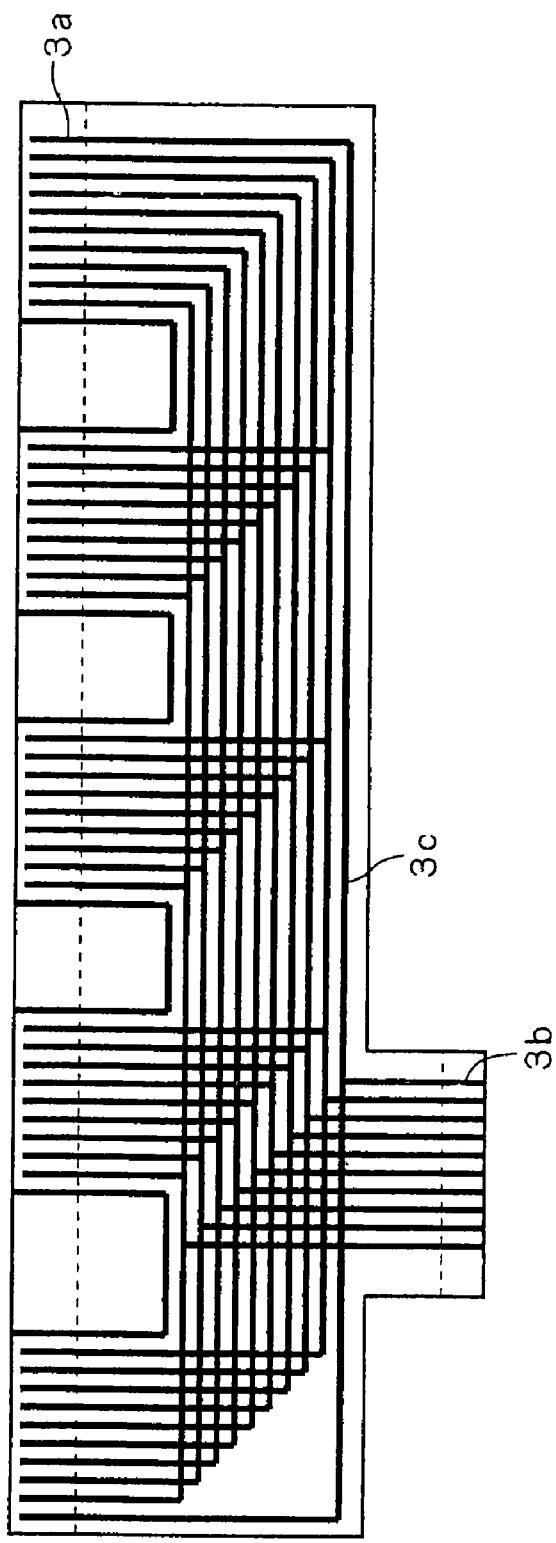
FIG. 7 is a plan view of an FPC according to a second preferred embodiment of the invention.

FIG. 7 is a plan view of an FPC 3 according to a second preferred embodiment. In the FPC 3 shown in FIG. 7, FPC terminals 3*a* and FPC input terminals 3*b* are connected through FPC interconnections 3*c*. Also, in the FPC 3 of FIG. 7, the FPC terminals 3*a* are provided in five areas while the FPC input terminals 3*b* are provided in one area.

Figure 8:
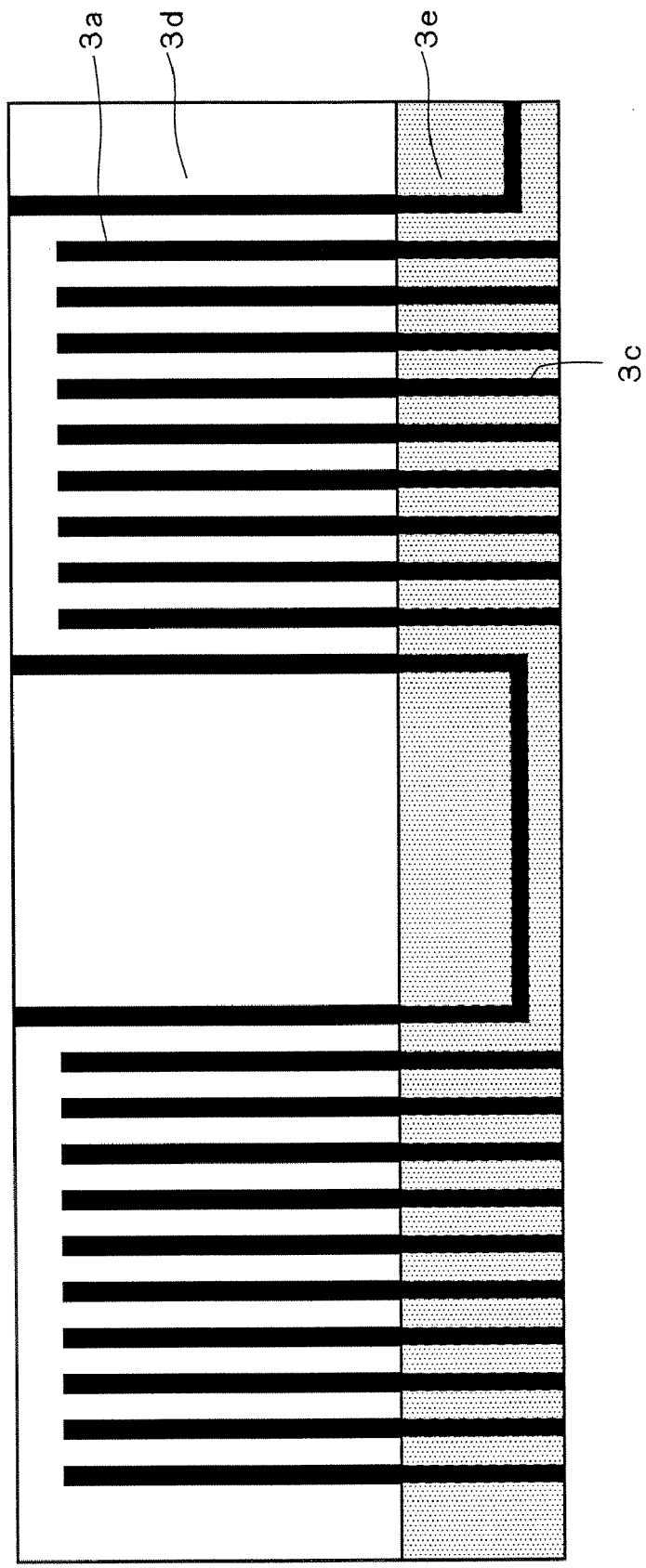
FIG. 8 is a plan view showing FPC terminals according to the second preferred embodiment of the invention.

FIG. 8 is an enlarged view of an area of the FPC 3 that includes FPC terminals 3*a* shown in FIG. 7. Like the area including FPC terminals 3*a* shown in FIG. 4A, the area including the FPC terminals 3*a* shown in FIG. 8, too, is formed of the FPC film 3*d* made of an insulative film, the FPC interconnections 3*c* and FPC terminals 3*a* made of copper foil, and the polyimide-based solder resist 3*e* covering the FPC interconnections 3*c*.

However, the FPC 3 shown in FIGS. 7 and 8 differs from the FPC 3 shown in FIGS. 3 and 4A in that some FPC terminals 3*a* are connected with each other through FPC interconnections 3*c* and the ends of those FPC terminals 3*a* are formed to reach the outline of the FPC film 3*d*. That is, when FPC terminals 3*a* that make external connections on the same side are connected together through an FPC interconnection 3*c* (in this preferred embodiment, all FPC terminals 3*a* are connected to the display panel on the same side and the FPC input terminals 3*b* are connected to the driver circuitry on a different side), the ends of those FPC terminals 3*a* are formed to reach the outline of the FPC film 3*d*.

When an FPC terminal 3*a* and an FPC terminal 3*a* are connected together through an FPC interconnection 3*c*, those FPC terminals 3*a* are not supplied with signals like an image signal from the FPC input terminals 3*b*. Accordingly, as shown in this preferred embodiment, the FPC 3 may be structured such that only the ends of the FPC terminals 3*a* that greatly affect the reliability of the display device are located inside the outline of the FPC film 3*d*.

As described above, in the FPC 3 of this preferred embodiment, when FPC terminals 3*a* that are connected to the outside on the same side are connected through an FPC interconnection 3*c*, the ends of those FPC terminals 3*a* are formed to reach the outline of the FPC film 3*d*. It is thus possible to prevent water from invading the ACF 9 by applying the structure of the first preferred embodiment only to FPC terminals 3*a* that require the prevention.

While the invention has been described in detail, the foregoing description is in all aspects illustrative and not restrictive. It is understood that numerous other modifications and variations can be devised without departing from the scope of the invention.

What is claimed is:

1. A flexible printed circuit comprising:
    a flexible insulative film;
    interconnections formed of a given pattern on said insulative film;
    a resist layer covering said interconnections; and
    terminals provided at ends of said interconnections to make external connections,
    wherein, when said terminals which has its end located inside an outline of said insulative film makes external connections through a connected area, said area is covered by said insulative film so as to seal off said area from the outside environment.

2. The flexible printed circuit according to claim 1, wherein,
    when ones of said terminals that make external connections on a same side are only connected together through a corresponding one of said interconnections, those ones of said terminals have their ends formed to reach the outline of said insulative film.

3. A display device comprising:
    a display panel having in its peripheral area a plurality of electrode terminals that supply a signal necessary for driving; and
    a flexible printed circuit comprising a flexible insulative film, interconnections formed of a given pattern on said insulative film, a resist layer covering said interconnections, and terminals provided at ends of said interconnections to make external connections,
    wherein
    at least one of said terminals has its end located inside an outline of said insulative film, and
    when said terminals which has its end located inside an outline of said insulative film is connected to corresponding said electrode terminals through a connected area, said connected area is covered by said insulative film so as to seal off said area from the outside environment.

4. The display device according to claim 3, wherein a resin coating is applied to a peripheral area of said display panel including an area where said terminals and said electrode terminals are connected together.

5. A display device comprising:
    a display panel having in its peripheral area a plurality of electrode terminals that supply a signal necessary for driving; and
    a flexible printed circuit comprising a flexible insulative film, interconnections formed of a given pattern on said insulative film, a resist layer covering said interconnections, and terminals provided at ends of said interconnections to make external connections, wherein at least one of said terminals has its end located inside an outline of said insulative film, and wherein, when ones of said terminals that make external connections on a same side are only connected together through a corresponding one of said interconnections, those ones of said terminals have their ends formed to reach the outline of said insulative film,
    wherein said at least one terminal having its end located inside the outline of said insulative film is connected to a corresponding one of said electrode terminals.

6. The display device according to claim 5, wherein a resin coating is applied to a peripheral area of said display panel including an area where said terminals and said electrode terminals are connected together.

7. A display comprising:
    (a) a first substrate:
    (b) a second substrate parallel to and overlapping said first substrate but spaced from said first substrate, said second substrate being larger than said first substrate and extending beyond said first substrate to define a peripheral area that does not overlap said first substrate;
    (c) a flexible printed circuit attached to said peripheral area, said flexible printed circuit comprising flexible printed circuit terminals, flexible printed circuit interconnections, and flexible printed circuit film made of an insulative film;
    (d) electrode terminals overlapping the flexible printed circuit terminals, said electrode terminals being electrically connected to said flexible printed circuit interconnections;
    (e) panel interconnections electrically connected to the electrode terminals;
    (f) sealing material underlying the outer periphery of said first substrate;
    (g) insulating film formed on said panel interconnections in an area extending from sealing material to said electrical terminals;
    (h) an anisotropic conductive film disposed between said panel interconnections and said flexible printed circuit films;
    (i) an insulative coating material in contact with both said first substrate and said flexible printed circuit film,
    wherein:
    (j) said flexible printed circuit terminals have inboard ends which do not extend as close to said first substrate as do the inboard ends of said flexible printed circuit film;
    (k) said flexible printed circuit film extends inwardly beyond said flexible printed circuit terminals;
    (l) said flexible printed circuit film covers an inboard edge of said anisotropic conductive film; and
    (m) said flexible printed circuit film is in contact with said insulating film, sealing off said anisotropic conductive film and said electrode terminals from the outside environment.

8. A display device as recited in claim 7, wherein a marginal portion of said flexible printed circuit film where said flexible printed circuit terminals are absent is formed thicker than the rest of said flexible printed circuit film.

* * * * *